(12) United States Patent
Tsurusaki et al.

(10) Patent No.: US 12,042,815 B2
(45) Date of Patent: Jul. 23, 2024

(54) SUBSTRATE PROCESSING APPARATUS FOR SUPPLYING GAS OF WATER REPELLENT AGENT AND SUBSTRATE PROCESSING METHOD

(71) Applicant: Tokyo Electron Limited, Tokyo (JP)

(72) Inventors: Kotaro Tsurusaki, Koshi (JP); Koji Yamashita, Koshi (JP); Yusuke Yamamoto, Koshi (JP); Koji Tanaka, Koshi (JP); Kouzou Kanagawa, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/489,045

(22) Filed: Sep. 29, 2021

(65) Prior Publication Data

US 2022/0105535 A1 Apr. 7, 2022

(30) Foreign Application Priority Data

Oct. 2, 2020 (JP) ................................. 2020-167493

(51) Int. Cl.
| | |
|---|---|
| *B05C 3/109* | (2006.01) |
| *B05C 3/02* | (2006.01) |
| *B05C 11/00* | (2006.01) |
| *B05C 11/10* | (2006.01) |
| *B05D 1/20* | (2006.01) |

(Continued)

(52) U.S. Cl.
CPC ............... *B05C 3/109* (2013.01); *B05C 3/02* (2013.01); *B05C 11/00* (2013.01); *B05C 11/1013* (2013.01); *B05D 1/20* (2013.01);

*C25D 21/04* (2013.01); *H01L 21/67017* (2013.01); *H01L 21/67057* (2013.01); *B05C 3/00* (2013.01)

(58) Field of Classification Search
CPC ..... H01L 21/67057; B05D 1/18; B05C 11/00; B05C 3/109; B05C 3/02; B05C 3/00
See application file for complete search history.

(56) References Cited

U.S. PATENT DOCUMENTS

| | | | | |
|---|---|---|---|---|
| 5,154,199 | A | * 10/1992 | Thompson | ........ H01L 21/67028 134/155 |
| 5,716,458 | A | * 2/1998 | Machino | .................. C23G 5/04 134/40 |

(Continued)

FOREIGN PATENT DOCUMENTS

JP 2019-140401 A 8/2019

*Primary Examiner* — Karl Kurple
(74) *Attorney, Agent, or Firm* — Venjuris, P.C.

(57) ABSTRACT

A substrate processing apparatus includes a processing tank, a holder, an organic solvent supply, a drainage port, a gas supply, and an exhaust port. The processing tank stores an aqueous layer. The holder holds a substrate. The organic solvent supply supplies an organic solvent onto the aqueous layer to form a liquid layer of the organic solvent. The drainage port discharges the aqueous layer from a bottom wall of the processing tank and causes the liquid layer of the organic solvent to descend from above the substrate to below the substrate. The gas supply supplies a gas of a water repellent agent to the liquid layer from above the processing tank while the liquid layer descends. The exhaust port is exposed on a side wall of the processing tank by the descending of the liquid layer and discharges the gas of the water repellent gas.

5 Claims, 9 Drawing Sheets

(51) Int. Cl.
*C25D 21/04* (2006.01)
*H01L 21/67* (2006.01)
*B05C 3/00* (2006.01)

(56) References Cited

U.S. PATENT DOCUMENTS

| | | | | |
|---|---|---|---|---|
| 6,164,297 | A * | 12/2000 | Kamikawa | H01L 21/67051 134/61 |
| 6,286,231 | B1 * | 9/2001 | Bergman | H01L 21/67028 34/558 |
| 2001/0047595 | A1 * | 12/2001 | Mehmandoust | H01L 21/67057 34/443 |
| 2006/0162745 | A1 * | 7/2006 | Nakatsukasa | H01L 21/67034 134/186 |
| 2007/0175062 | A1 * | 8/2007 | Toshima | H01L 21/67028 34/410 |
| 2007/0175387 | A1 * | 8/2007 | Kimura | H01L 21/67057 118/422 |
| 2008/0302395 | A1 * | 12/2008 | Tanaka | B08B 3/102 134/133 |
| 2012/0240958 | A1 * | 9/2012 | Higuchi | H01L 21/67051 134/10 |
| 2015/0332940 | A1 * | 11/2015 | Wang | H01L 21/67781 134/25.1 |
| 2016/0089696 | A1 * | 3/2016 | Kimura | H01L 21/67028 134/155 |
| 2019/0279884 | A1 * | 9/2019 | Yamashita | B05B 1/26 |

* cited by examiner

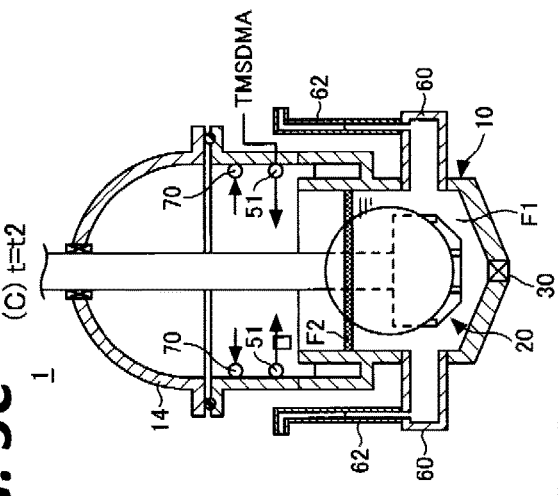
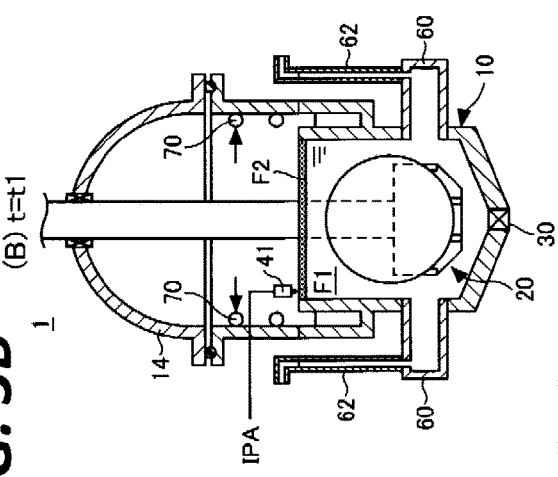
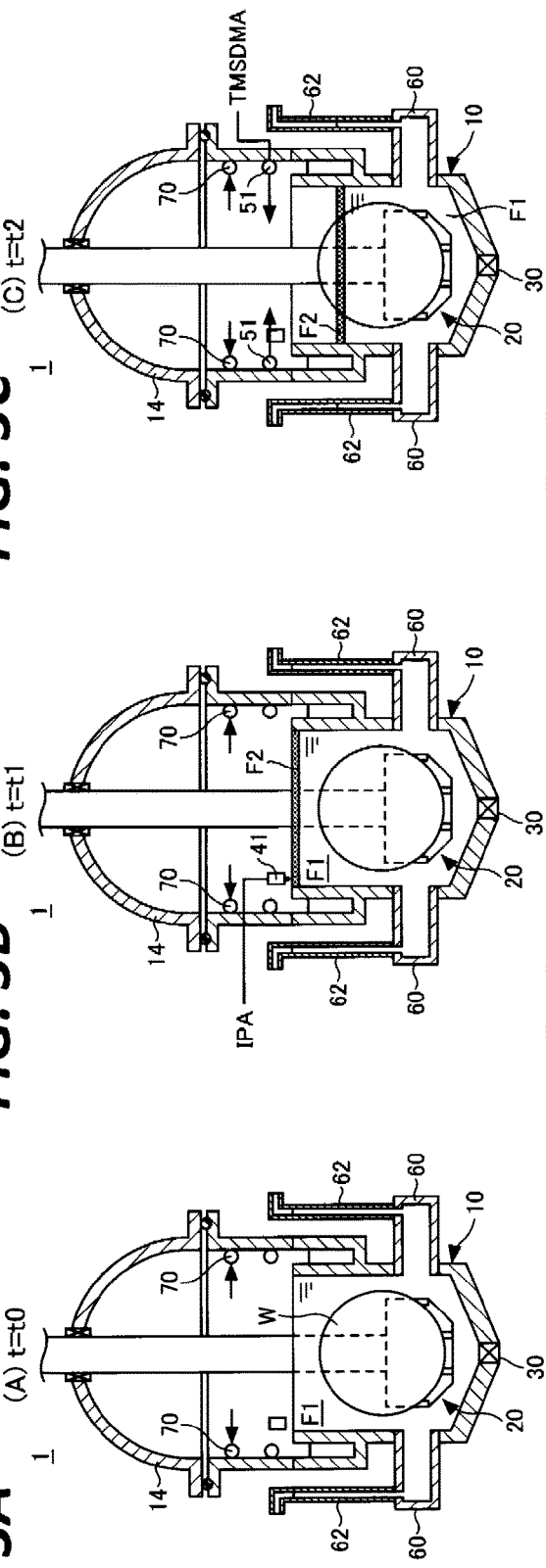
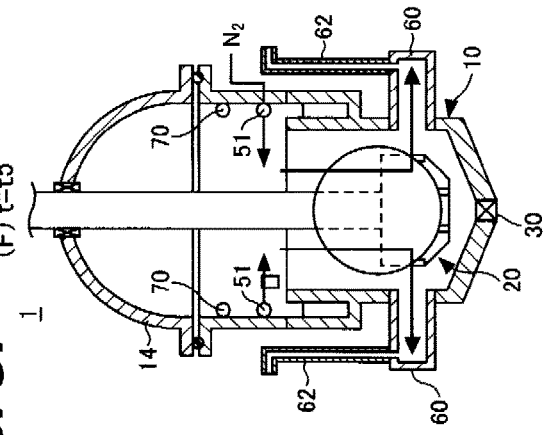
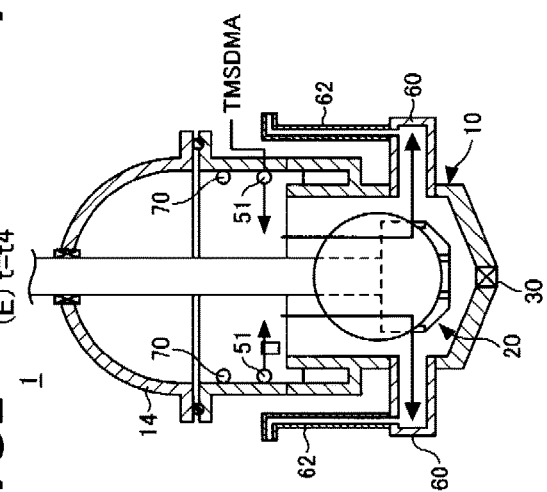
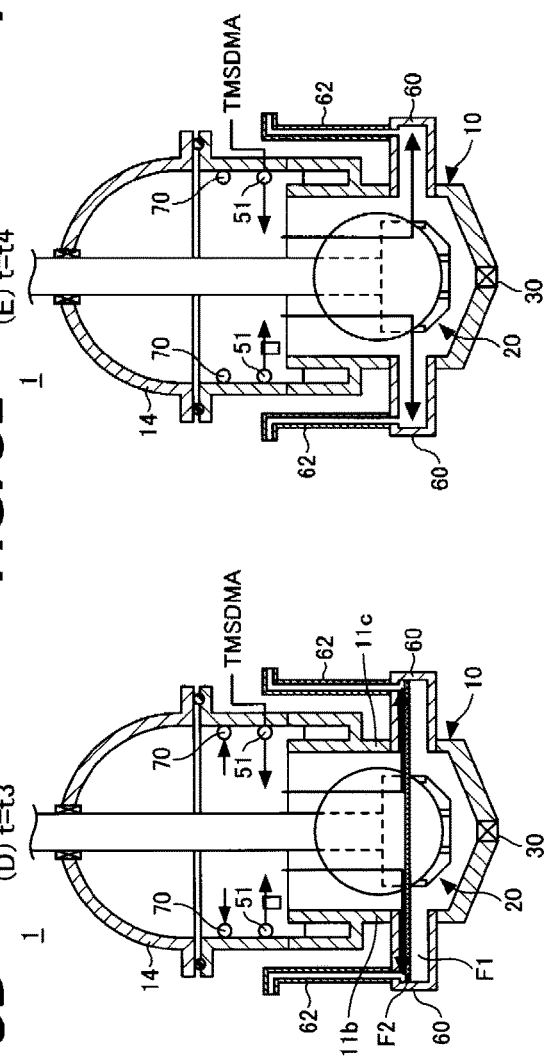

SUBSTRATE PROCESSING APPARATUS FOR SUPPLYING GAS OF WATER REPELLENT AGENT AND SUBSTRATE PROCESSING METHOD

CROSS-REFERENCE TO RELATED APPLICATION

This application is based on and claims priority from Japanese Patent Application No. 2020-167493 filed on Oct. 2, 2020 with the Japan Patent Office, the disclosure of which is incorporated herein in its entirety by reference.

TECHNICAL FIELD

The present disclosure relates to a substrate processing apparatus and a substrate processing method.

BACKGROUND

In the substrate processing method described in Japanese Patent Laid-Open Publication No. 2019-140401, before causing the surface of a substrate immersed in the pure water to be water repellent, the surface of the substrate is exposed to the isopropyl alcohol (IPA) (2-propanol) vapor to replace the pure water adhering to the surface of the substrate with IPA. Then, the substrate is immersed in a water repellent agent of a liquid phase stored inside a processing tank to cause the surface of the substrate to be water repellent. Subsequently, the substrate is pulled up from the liquid phase water repellent agent, and the pulled up substrate is exposed to the IPA vapor to remove the water repellent agent from the surface of the substrate. Finally, an inert gas is supplied toward the surface of the substrate to dry the surface of the substrate.

SUMMARY

According to an aspect of the present disclosure, a substrate processing apparatus includes a processing tank, a holder, an organic solvent supply, a drainage port, a gas supply, and an exhaust port. The processing tank stores an aqueous layer in which a substrate is immersed. The holder holds the substrate. The organic solvent supply supplies an organic solvent onto the aqueous layer, thereby forming a liquid layer of the organic solvent. The drainage port discharges the aqueous layer from a bottom wall of the processing tank and causes the liquid layer of the organic solvent to descend from above the substrate to below the substrate. The gas supply supplies a gas of a water repellent agent to the liquid layer from above the processing tank while the liquid layer descends. The exhaust port is exposed on a side wall of the processing tank by the descending of the liquid layer and discharges the gas of the water repellent gas.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 3A is a view illustrating a substrate processing apparatus at time t0 in FIG. 4, FIG. 3B is a view illustrating a substrate processing apparatus at time t1 in FIG. 4, FIG. 3C is a view illustrating a substrate processing apparatus at time t2 in FIG. 4, FIG. 3D is a view illustrating a substrate processing apparatus at time t3 in FIG. 4, FIG. 3E is a view illustrating a substrate processing apparatus at time t4 in FIG. 4, and FIG. 3F is a view illustrating a substrate processing apparatus at time t5 in FIG. 4.

DETAILED DESCRIPTION

Figure 1:
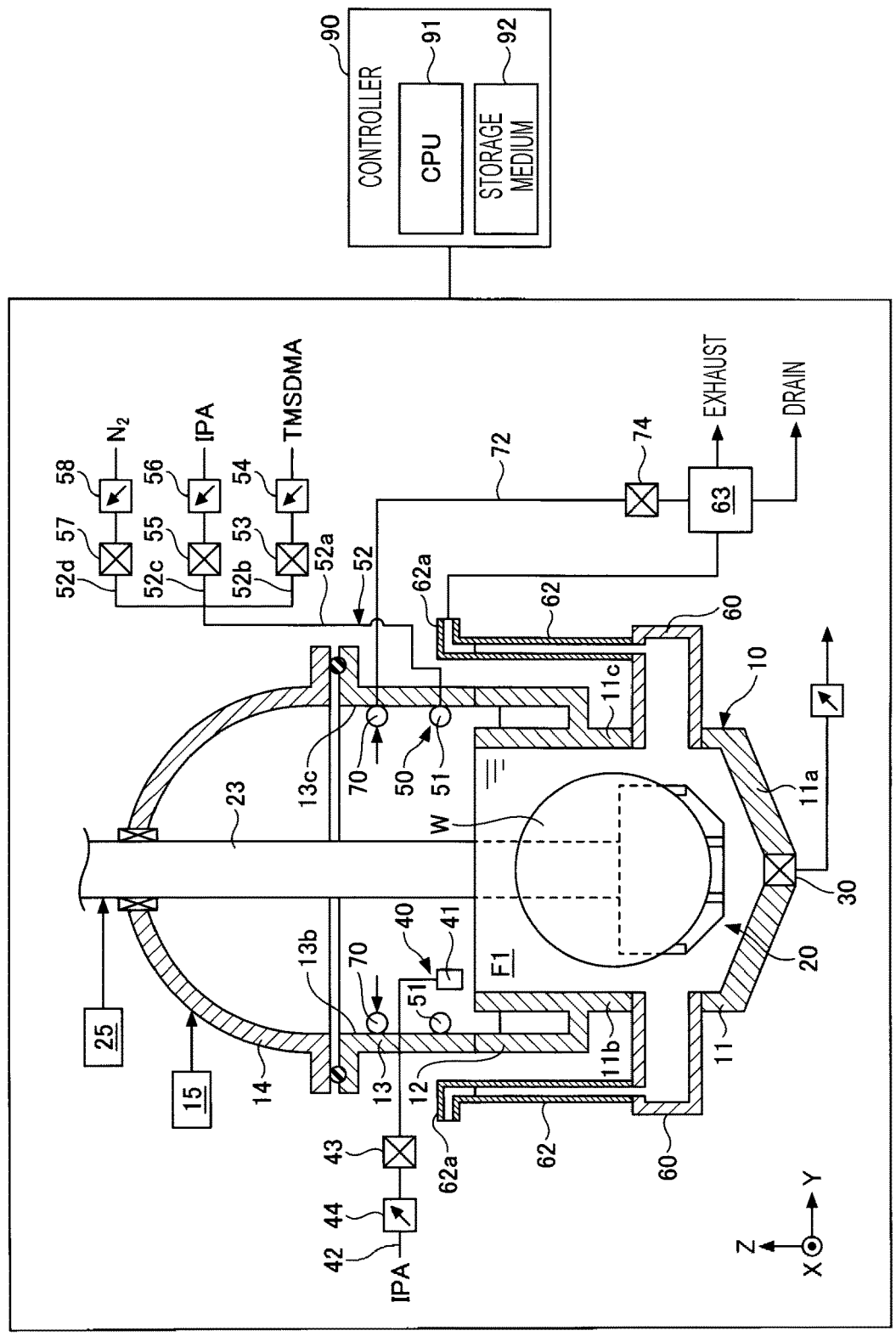
FIG. 1 is a cross-sectional view of a substrate processing apparatus according to an embodiment as viewed from the X-axis direction.

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, embodiments of the present disclosure will be described with reference to the accompanying drawings. In each drawing, the same or corresponding components may be designated by the same reference numerals and descriptions thereof may be omitted. In the present specification, the X-axis direction, the Y-axis direction, and the Z-axis direction are perpendicular to each other. The X-axis direction and the Y-axis direction are the horizontal directions, and the Z-axis direction is the vertical direction.

First, the substrate processing apparatus 1 of the present embodiment will be described with reference to FIG. 1. The substrate processing apparatus 1 includes a processing tank 10 that stores an aqueous layer F1 in which a substrate W is immersed, a tubular upper side wall 13 that surrounds the space above the processing tank 10, a cover 14 that closes the space above the processing tank 10, and an opening/closing mechanism 15 that raises and lowers the cover 14 and opens/closes the space above the processing tank 10. The substrate W includes a silicon wafer or a compound semiconductor wafer, and electronic circuits formed on the silicon wafer or the compound semiconductor wafer. The substrate W includes an uneven pattern on its surface.

The processing tank 10 includes an inner tank 11 in which the aqueous layer F1 is stored and a square frame-shaped outer tank 12 surrounding the upper end of the inner tank 11. The inner tank 11 is a box-shaped tank with an open upper part. A nozzle (not illustrated) is provided inside the inner tank 11 to supply water such as deionized water (DIW). Water overflowing from the upper end of the inner tank 11 flows into the outer tank 12. A discharge pipe (not illustrated) is provided at the bottom of the outer tank 12 to discharge water.

The upper side wall 13 surrounds the space above the processing tank 10. For example, the upper side wall 13 extends upward from the upper end of the outer tank 12. A flange is formed at the upper end of the upper side wall 13. The cover 14 is placed on the flange. The cover 14 has a dome shape that is convex upward when viewed in the X-axis direction. A flange is formed at the lower end of the cover 14, and the flange is disposed to face the flange of the upper side wall 13.

The opening/closing mechanism 15 opens the space above the processing tank 10 by raising the cover 14. In that state, an external transfer device and a holder 20 (to be described later) deliver the substrate W. Further, the opening/closing mechanism 15 seals the space above the processing tank 10 by lowering the cover 14.

Figure 2A:
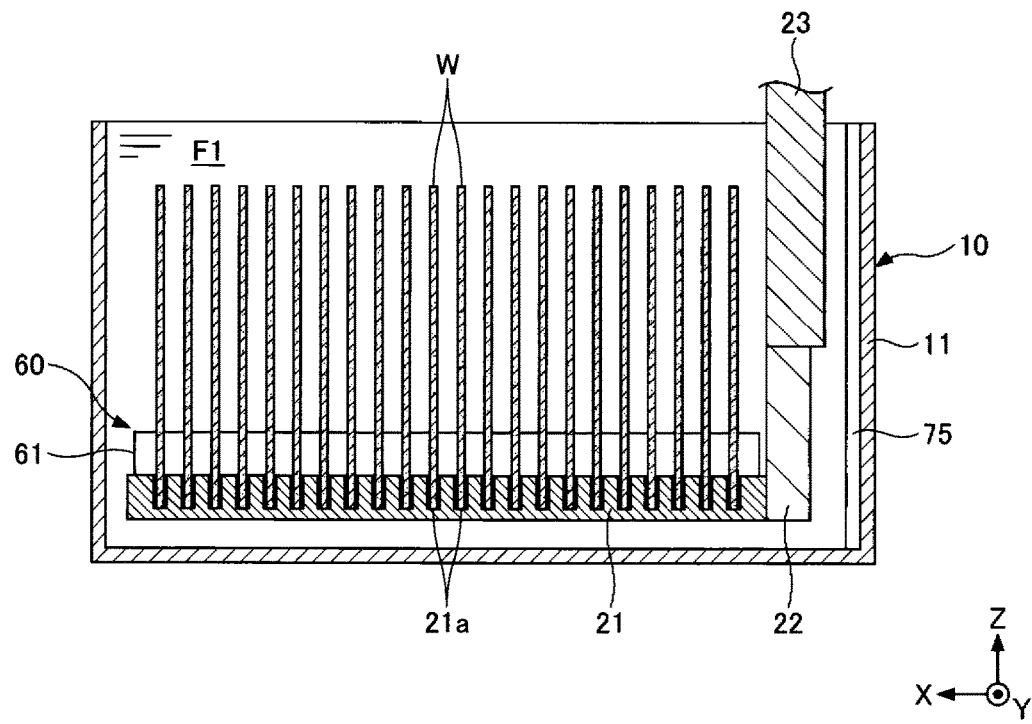
FIG. 2A is a cross-sectional view of a processing tank of FIG. 1 as viewed from the Y-axis direction.
Figure 2B:
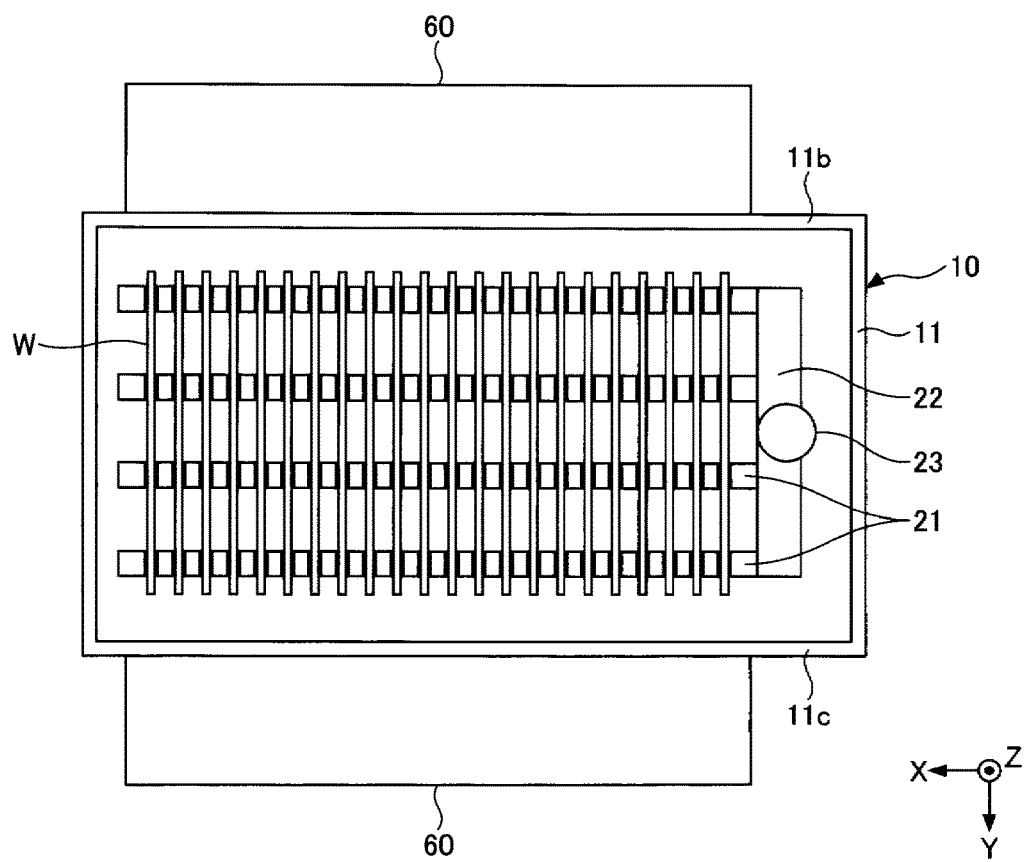
FIG. 2B is a plan view of the processing tank of FIG. 1 as viewed from the Z-axis direction.

The plasma processing apparatus 1 includes a holder 20 that holds the substrate W. As illustrated in FIGS. 2A and 2B, the holder 20 holds, for example, a plurality of substrates W at intervals in the X-axis direction, and holds each of the plurality of substrates W vertically upright. The holder 20 includes a plurality of arms 21 that extends in the X-axis direction, a blanket 22 that cantilevers and supports the plurality of arms 21, and an elevating rod 23 that extends directly upward from the blanket 22.

Each of the plurality of arms 21 includes grooves 21a at equal pitches in the X-axis direction. A peripheral edge of the substrate W is inserted into the groove 21a. The plurality of arms 21 hold the peripheral edge of each substrate W at a plurality of points. The elevating rod 23 is inserted into a through hole of the cover 14, and a sealing mechanism is provided in the through hole.

The substrate processing apparatus 1 includes an elevating mechanism 25 that raises and lowers the holder 20. The elevating mechanism 25 raises and lowers the holder 20 between the immersion position inside the processing tank 10 and the loading/unloading position above the upper side wall 13. The holder 20 first receives the substrate W from the external transfer device at the loading/unloading position, then immerses the substrate W in the aqueous layer F1 at the immersion position, and finally delivers the substrate W to the external transfer device at the loading/unloading position.

The substrate processing apparatus 1 includes a drainage port 30 that discharges the aqueous layer F1 from the bottom wall of the processing tank 10. The drainage port 30 is provided on the bottom wall 11a of the inner tank 11. After the substrate W is cleaned, the drainage port 30 discharges the aqueous layer F1, so that the height of the liquid level of the aqueous layer F1 drops from above the substrate W to below the substrate W, and the substrate W is dried.

The substrate processing apparatus 1 includes an organic solvent supply 40 that supplies an organic solvent onto the aqueous layer F1 to form a liquid layer F2 (see, e.g., FIG. 3B) of the organic solvent in order to suppress the uneven pattern on the surface of the substrate from collapsing due to the surface tension of the liquid surface occurring when the height of the liquid level of the aqueous layer F1 decreases.

The drainage port 30 causes the liquid layer F2 of the organic solvent to descend from above the substrate W to below the substrate W by discharging the aqueous layer F1. While the liquid layer F2 is descending, the substrate W is held by the holder 20, and the holder 20 is in the immersion position. As the liquid layer F2 descends, the water adhering to the surface of the substrate W is replaced with the organic solvent. The surface tension of the organic solvent is lower than the surface tension of water, and it is possible to suppress the collapse of the uneven pattern on the surface of the substrate.

The organic solvent preferably has a density lower than that of water so that the laminated structure of the aqueous layer F1 and the liquid layer F2 does not collapse. The organic solvent is preferably water-soluble so that the water that has entered the recesses on the surface of the substrate is easily replaced by the organic solvent. The term "water-soluble" means, for example, that the amount dissolved in 100 g of water (the limit amount that can be dissolved in 100 g of water) is 10 g or more. Specific examples of a water-soluble organic solvent include:

IPA (2-propanol): density of 0.786 $g/cm^3$; and

Acetone: density of 0.791 $g/cm^3$

Further, a water-insoluble liquid layer may be formed between the aqueous layer F1 and the liquid layer F2. The water-insoluble liquid layer separates the aqueous layer F1 from the water-soluble liquid layer F2, and suppresses the reaction between the water repellent agent (to be described later) contained in the liquid layer F2 and water. Specific examples of a water-insoluble organic solvent include:

DBE (dibutyl ether): dissolution amount of 30 mg, density of 0.764 $g/cm^3$;

nBA (butyl acetate): dissolution amount of 1.4 g, density of 0.882 $g/cm^3$;

Propyl acetate: dissolution amount of 1.89 g, density of 0.890 $g/cm^3$;

Ethyl acetate: dissolution amount of 8.3 g, density of 0.897 $g/cm^3$; and

Cyclohexanone: dissolution amount of 8.7 g, density of 0.950 $g/cm^3$

The organic solvent supply 40 includes, for example, a nozzle 41 for supplying the organic solvent onto the aqueous layer F1 and a supply line 42 for supplying the organic solvent to the nozzle 41. An on-off valve 43 for opening and closing the flow path of the organic solvent and a flow rate controller 44 for controlling the flow rate of the organic solvent are provided in the middle of the supply line 42. The nozzle 41 is provided near the side wall of the inner tank 11, and discharges an organic solvent toward, for example, the side wall of the inner tank 11. The organic solvent is gently supplied onto the aqueous layer F1 along the side wall of the inner tank 11.

The organic solvent supply 40 discharges a liquid phase organic solvent from the nozzle 41. However, the organic solvent supply 40 may discharge a gas phase organic solvent from the nozzle 41. The gas phase organic solvent is condensed on the aqueous layer F1 to form a liquid layer of the organic solvent on the aqueous layer F1.

The substrate processing apparatus 1 includes a gas supply 50 that supplies the gas of a water repellent agent to the liquid layer F2 of the organic solvent from above the processing tank 10 in order to further suppress the collapse of the uneven pattern on the surface of the substrate. The gas of the water repellent agent dissolves in the liquid layer F2 of the organic solvent, and the water repellent agent contained in the liquid layer F2 makes the surface of the substrate water repellent. The surface of the substrate may be made water repellent before the surface tension of the liquid surface acts on the surface of the substrate. As a result, the surface tension acting on the surface of the substrate may be reduced, and the collapse of the uneven pattern on the surface of the substrate surface may be further suppressed.

As for the water repellent agent, for example, an agent having a Si—N bond is used. The water repellent agent having a Si—N bond may make the surface of the substrate water repellent even in a liquid. The surface of the substrate may be made water repellent before the surface tension of the liquid surface acts on the surface of the substrate. Examples of the water repellent agent having a Si—N bond include those represented by the following general formula (1).

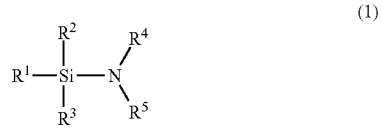

(1)

In the general formula (1), each of $R^2$, $R^3$, $R^4$, and $R^5$ is a functional group such as an alkyl group or a group in which at least a part of hydrogen atoms of the alkyl group is substituted with fluorine.

Specific examples of the general formula (1) include:
(Trimethylsilyl)dimethylamine (N, N-Dimethyltimelysyllamine: TMSMA);
Nonafluorohexyldimethyl(dimethylamino)silane (NFHDMA);
Dimethylaminotriethylsilane ((N, N-Dimethylamino)triethylsilane);
Butyldimethyl(dimethylamino)silane; and
n-Octyldimethyl(dimethylamino)silane The water repellent agent having a Si—N bond may be one other than those represented by the general formula (1) may be used. For example, hexamethyldisilazane (1,1,1,3, 3,3-Hexamethyldisilazane: HMDS) may be used.

TMSDMA reacts with silanol groups (Si—OH groups) on the surface of the substrate to make the surface of the substrate water repellent. Since this reaction occurs even in a liquid, a water repellent effect may be obtained even in a liquid. The same applies to water repellent agents having a Si—N bond other than TMSDMA.

According to the present embodiment, the substrate W is made water repellent by the water repellent agent contained in the liquid layer F2. Therefore, the amount of the water repellent agent used may be reduced as compared with the case where the water repellent agent layer is formed on the entire inner tank 11 as described in Japanese Patent Laid-Open Publication No. 2019-140401. Further, the substrate W may be made water repellent and dried by removing the liquid once, and the throughput may be improved.

The gas supply 50 includes a nozzle 51 that supplies the gas of the water repellent agent to the liquid layer F2 of the organic solvent from above the processing tank 10, and a supply line 52 that supplies the gas of the water repellent agent to the nozzle 51. An on-off valve 53 for opening and closing the flow path of the gas of the water repellent agent and a flow rate controller 54 for controlling the flow rate of the gas of the water repellent agent are provided in the middle of the supply line 52.

The nozzle 51 is a tube parallel to the arrangement direction (X-axis direction) of the substrate W, and has a plurality of discharge ports at intervals in the arrangement direction of the substrate W. The nozzles 51 are provided on both sides (both sides in the Y-axis direction) with the substrate W interposed therebetween, and discharge the gas of the water repellent agent inward. The nozzle 51 may discharge a mixed gas of the gas of the water repellent agent and the carrier gas. As for the carrier gas, an inert gas such as $N_2$ gas is used.

The nozzle 51 may discharge a gas of an organic solvent such as IPA, or may discharge a mixed gas of the gas of the organic solvent and the carrier gas. The gas of the organic solvent condenses on the surface of the substrate and washes away excess water repellent agents remaining on the surface of the substrate.

The nozzle 51 may discharge $N_2$ gas. The $N_2$ gas discharges the gas remaining in the internal space of the processing tank 10 and the space above the processing tank 10 (e.g., the gas of the water repellent agent or the gas of the organic solvent). The $N_2$ gas may be preheated.

The supply line 52 includes a common line 52a and a plurality of individual lines 52b to 52d. A downstream end of the common line 52a is connected to the nozzle 51, and an upstream end of the common line 52a is connected to the plurality of individual lines 52b to 52d. An on-off valve 53 for opening and closing the flow path of the gas of the water repellent agent and a flow rate controller 54 for controlling the flow rate of the gas of the water repellent agent are provided in the middle of the individual line 52b. Further, an on-off valve 55 for opening and closing the flow path of the gas of the organic solvent and a flow rate controller 56 for controlling the flow rate of the gas of the organic solvent are provided in the middle of the individual line 52c. Also, an on-off valve 57 for opening and closing the flow path of $N_2$ gas and a flow rate controller 58 for controlling the flow path of $N_2$ gas are provided in the middle of the individual line 52d.

The gas supply 50 supplies the gas of the water repellent agent to the liquid layer F2 from above the processing tank 10 while the liquid layer F2 is descending.

In the related art, as the liquid layer F2 descends, a distance between the liquid layer F2 and the nozzle 51 becomes longer, and the amount of the water repellent agent contained in the liquid layer F2 becomes insufficient, and thus, the effect of making the surface of the substrate water repellent could not be sufficiently obtained. This problem was remarkable at the lower part of the substrate W.

Therefore, the substrate processing apparatus 1 of the present embodiment includes an exhaust port 60 that is exposed on the side wall of the processing tank 10 due to the descent of the liquid layer F2 and discharges the gas of the water repellent agent. The exhaust port 60 is below the liquid level of the liquid layer F2 at the start of descent of the liquid layer F2, and appears above the liquid level of the liquid layer F2 during the descent of the liquid layer F2.

Since the exhaust port 60 exists at a low position on the side wall of the processing tank 10, a downward flow of the gas of the water repellent agent may be formed inside the processing tank 10. Therefore, even when the distance between the liquid layer F2 and the nozzle 51 becomes longer, the water repellent agent may be sufficiently supplied to the liquid layer F2, and the entire substrate W may be made water repellent.

The exhaust port 60 may not be connected to a suction source such as a vacuum pump or an ejector. The gas supply 50 supplies the gas of the water repellent agent above the processing tank 10, and the supplied gas pushes the gas inside the processing tank 10 to the exhaust port 60, so that the gas is naturally exhausted.

When at least a part of the exhaust port 60 appears above the liquid level of the liquid layer F2, the exhaust by the exhaust port 60 starts naturally.

Compared with the case where the exhaust is forcibly performed by the suction source, it is possible to suppress the pressure inside the processing tank 10 from becoming more negative than the outside, and it is possible to suppress particles from being drawn into the inside from the outside of the processing tank 10. In addition, it is possible to suppress a decrease in the gas concentration of the water repellent agent inside the processing tank 10 as compared with the case where the exhaust is forcibly performed by the suction source.

As illustrated in FIG. 2A, the exhaust port 60 is provided below, for example, the center of the substrate W. A downward flow of the gas of the water repellent agent may be formed below the center of the substrate W, and the lower part of the substrate W may also be sufficiently water repellent.

As illustrated in FIG. 2A, the exhaust port 60 has, for example, a rectangular exhaust port 61. The rectangular exhaust port 61 is long in the arrangement direction (X-axis direction) of the substrate W, and is formed so as to overlap with all substrates W in the Y-axis direction. All substrates W may be made water repellent uniformly.

As illustrated in FIG. 2B, the exhaust port 60 is provided on a pair of side walls 11b and 11c of the inner tank 11 facing each other. The pair of side walls 11b and 11c are disposed at intervals in the Y-axis direction. Compared with the case where the exhaust port 60 is provided only on one side wall (e.g., the side wall 11b), each substrate W may be made water repellent uniformly.

Figure 5:
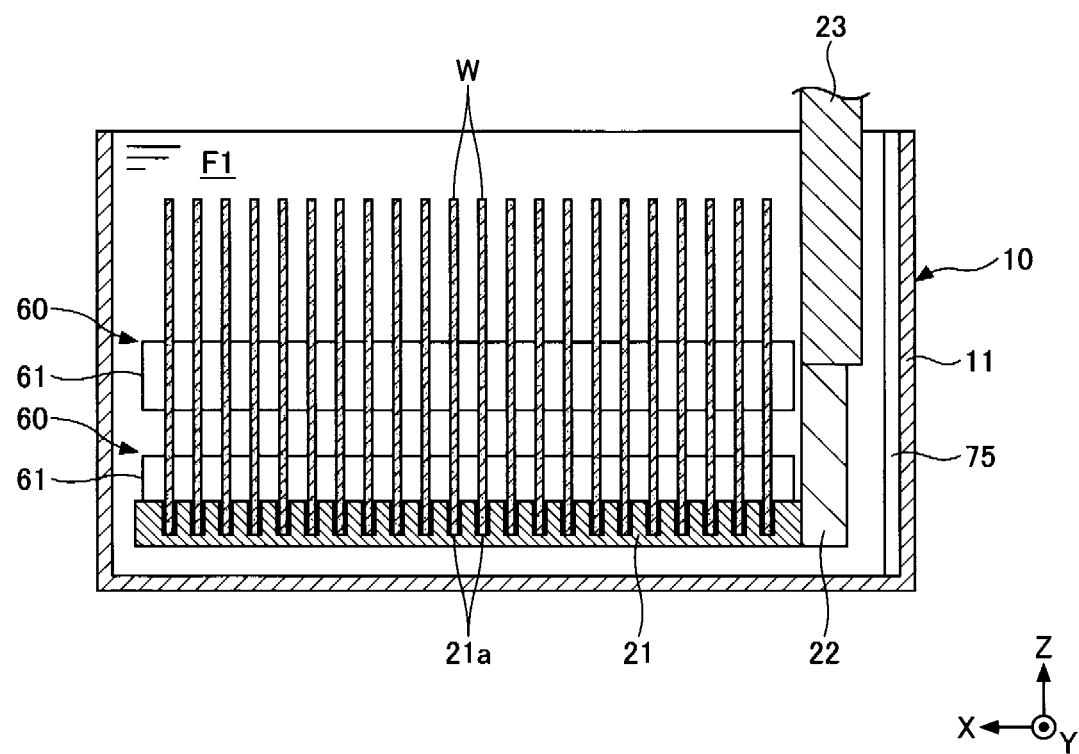
FIG. 5 is a cross-sectional view of a processing tank according to a first modification as viewed from the Y-axis direction.
Figure 6:
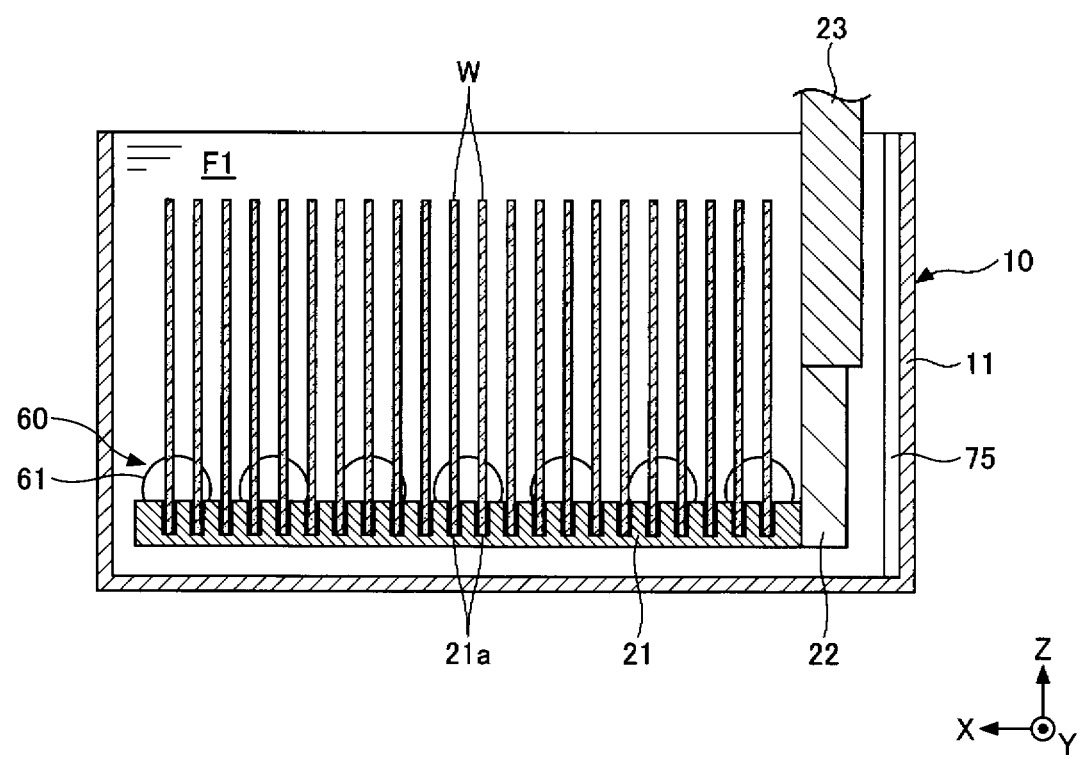
FIG. 6 is a cross-sectional view of a processing tank according to a second modification as viewed from the Y-axis direction.
Figure 7:
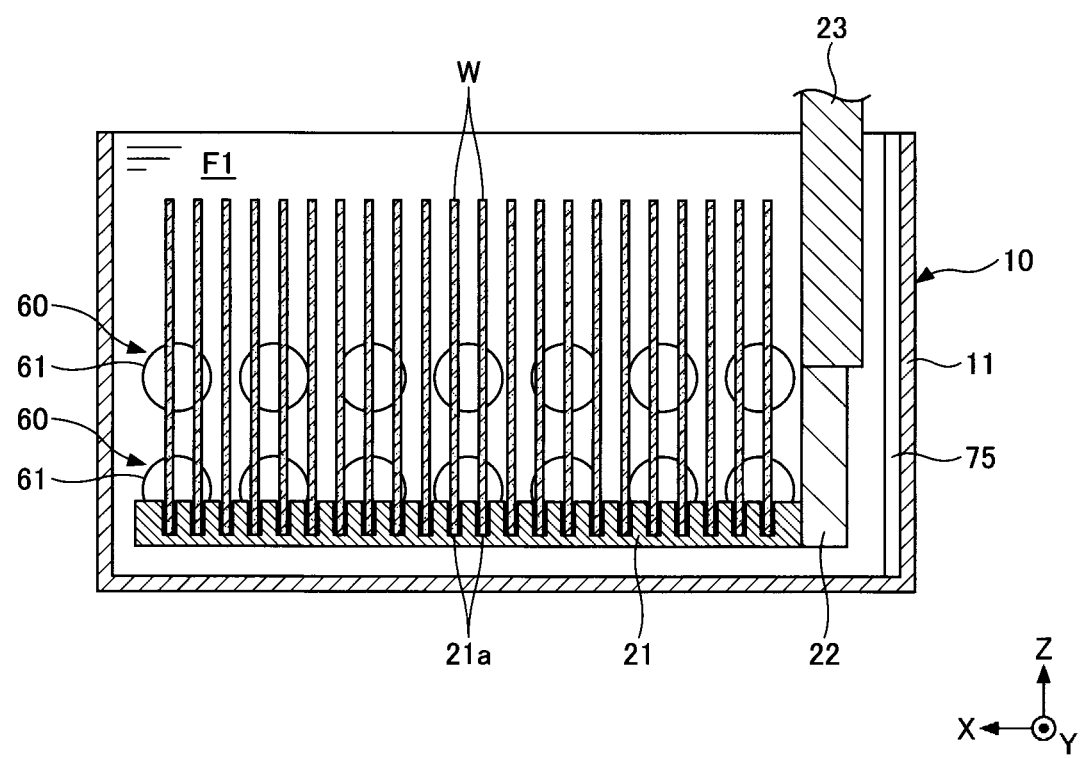
FIG. 7 is a cross-sectional view of a processing tank according to a third modification as viewed from the Y-axis direction.
Figure 8:
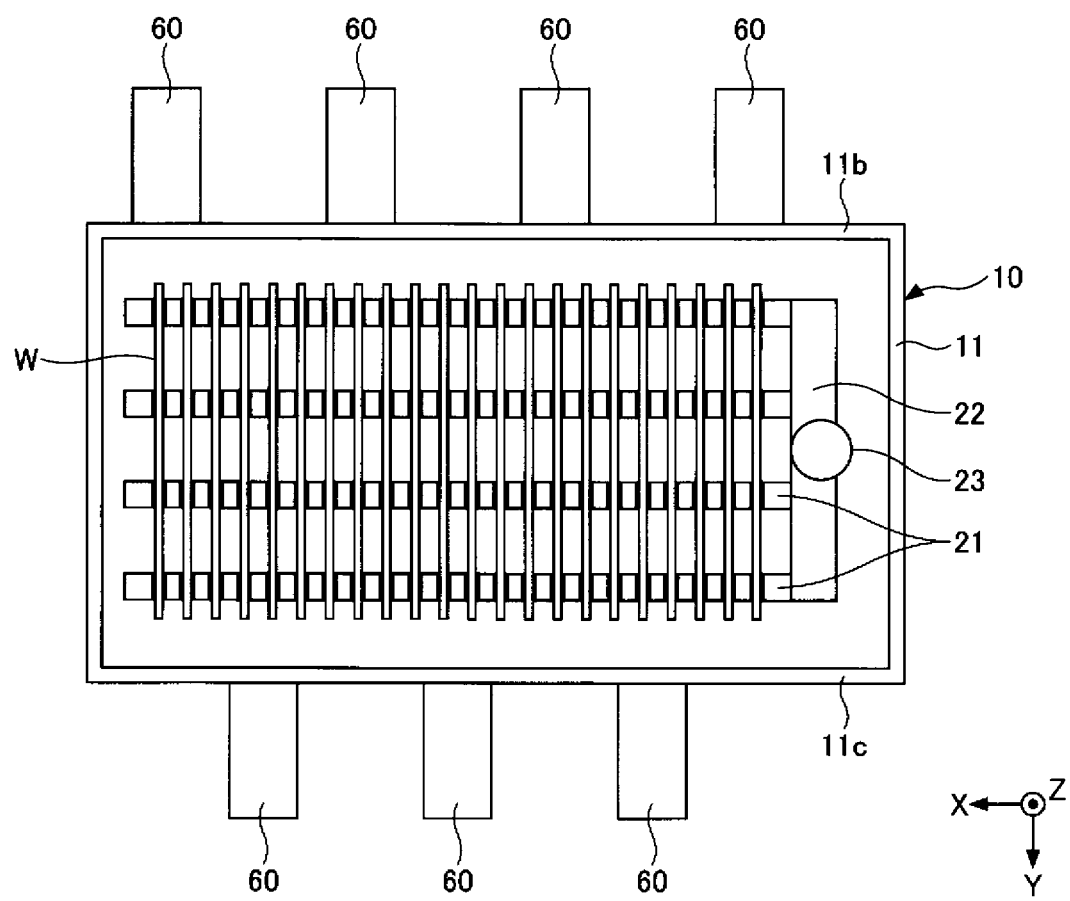
FIG. 8 is a cross-sectional view of a processing tank according to a fourth modification as viewed from the Z-axis direction.

As illustrated in FIG. 5, a plurality of exhaust ports 60 may be provided in the vertical direction. The shape of the exhaust port 61 is not limited to a rectangle, and may be circular or elliptical as illustrated in FIG. 6. As illustrated in FIG. 6, a plurality of exhaust ports 60 may be disposed in a row in the X-axis direction, and as illustrated in FIG. 7, a plurality of exhaust ports 60 may be disposed in a matrix in the X-axis direction and the Z-axis direction. Further, as illustrated in FIG. 8, the exhaust ports 60 may be staggered on the pair of side walls 11b and 11c.

As illustrated in FIG. 1, a substrate processing system 1 includes an exhaust line 62 extending from the exhaust port 60. The height of an upper end 62a of the exhaust line 62 may be higher than the height of the upper end of the processing tank 10 (specifically, the inner tank 11). That is, the height of the upper end 62a of the exhaust line 62 may be higher than the height of the liquid layer F2 at the start of descent. A liquid such as water that has entered the exhaust line 62 may not get over the upper end 62a of the exhaust line 62 against gravity. Therefore, the exhaust line 62 may not have an on-off valve for opening and closing the flow path of gas.

Figure 9:
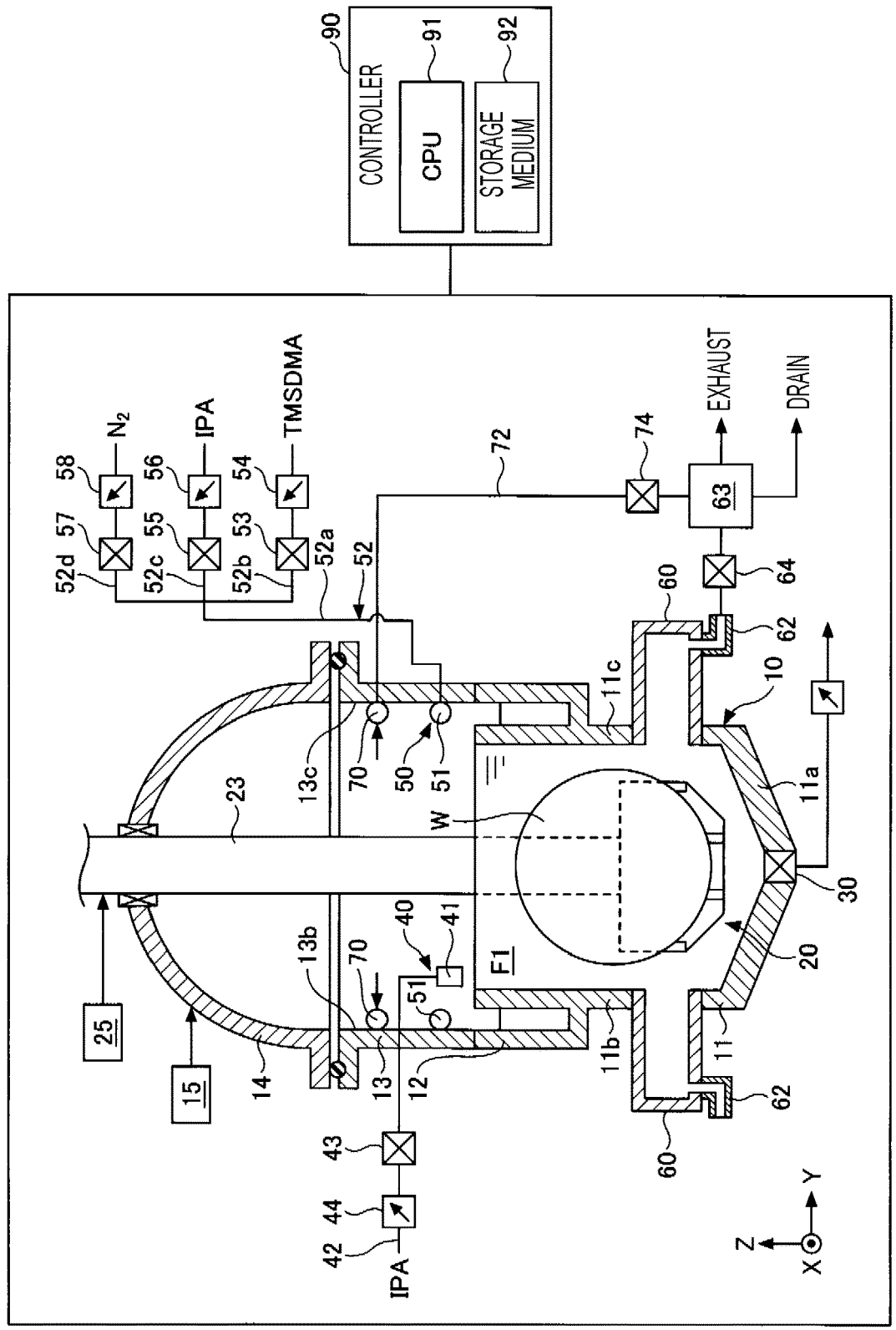
FIG. 9 is a cross-sectional view of a substrate processing apparatus according to a fifth modification as viewed from the X-axis direction.

As illustrated in FIG. 9, the height of the exhaust line 62 over the entire exhaust line 62 may be lower than the height of the upper end of the processing tank 10. The exhaust line 62 is easy to handle, and the length of the exhaust line 62 is shortened. In this case, the exhaust line 62 is provided with an on-off valve 64 so that less water passes through the exhaust line 62. When the on-off valve 64 opens the flow path of gas, the exhaust by the exhaust port 60 starts.

The substrate processing apparatus 1 includes a gas-liquid separator 63 connected to the exhaust port 60 via the exhaust line 62. The gas-liquid separator 63 separates the gas and the liquid and discharges them. The gas-liquid separator 63 may cool the gas and condense the liquid from the gas.

The substrate processing apparatus 1 includes a second exhaust port 70 provided above the processing tank 10. The second exhaust port 70 discharges the gas of the water repellent agent at least until the exhaust by the exhaust port 60 starts. It is possible to suppress an increase in the pressure inside the processing tank 10 and prevent an unintended leakage of the gas of the water repellent agent.

Like the exhaust port 60, the second exhaust port 70 may not be connected to a suction source such as a vacuum pump or an ejector. When the gas supply 50 supplies the gas of the water repellent agent above the processing tank 10, the gas in the space above the processing tank 10 is naturally exhausted to the second exhaust port 70.

The second exhaust port 70 is provided above, for example, the nozzle 51 of the gas supply 50. The second exhaust port 70 is provided on a pair of side walls 13b and 13c of the upper side wall 13 facing each other, and discharges gas from both sides in the Y-axis direction. The second exhaust port 70 includes an exhaust port parallel to the arrangement direction (X-axis direction) of the substrate W.

The substrate processing apparatus 1 includes a second exhaust line 72 extending from the second exhaust port 70. The second exhaust line 72 connects the second exhaust port 70 and the gas-liquid separator 63. An on-off valve 74 for opening and closing the flow path of gas is provided in the middle of the second exhaust line 72.

The on-off valve 74 opens and closes the flow path of gas under the control of a controller 90. The on-off valve 74 opens the flow path of gas at least until exhaust through the exhaust port 60 starts. Further, the on-off valve 74 closes the flow path of gas simultaneously with or after the start of the exhaust by the exhaust port 60, and stops the exhaust by the second exhaust port 70. By stopping the exhaust by the second exhaust port 70, as illustrated in FIG. 3E, a downward flow of the gas of the water repellent agent may be reliably formed inside the processing tank 10.

The substrate processing apparatus 1 may include a liquid level sensor 75 (see, e.g., FIG. 2A) that measures the height of the liquid level of the liquid layer F2 while the liquid layer F2 is descending. By monitoring the height of the liquid level with the liquid level sensor 75, the timing of opening and closing of the on-off valves 74 and 64 may be controlled with good control.

The substrate processing apparatus 1 includes a controller 90. The controller 90 is, for example, a computer, and includes a central processing unit (CPU) 91 and a storage medium 92 such as a memory. The storage medium 92 stores programs that control various processes executed in the substrate processing apparatus 1. The controller 90 controls the operation of the substrate processing apparatus 1 by causing the CPU 91 to execute the program stored in the storage medium 92. For example, controller 90 controls on-off valves 74 and 64 based on a measurement result of the height of the liquid level of the liquid layer F2 as measured by liquid level sensor 75.

Figure 4:
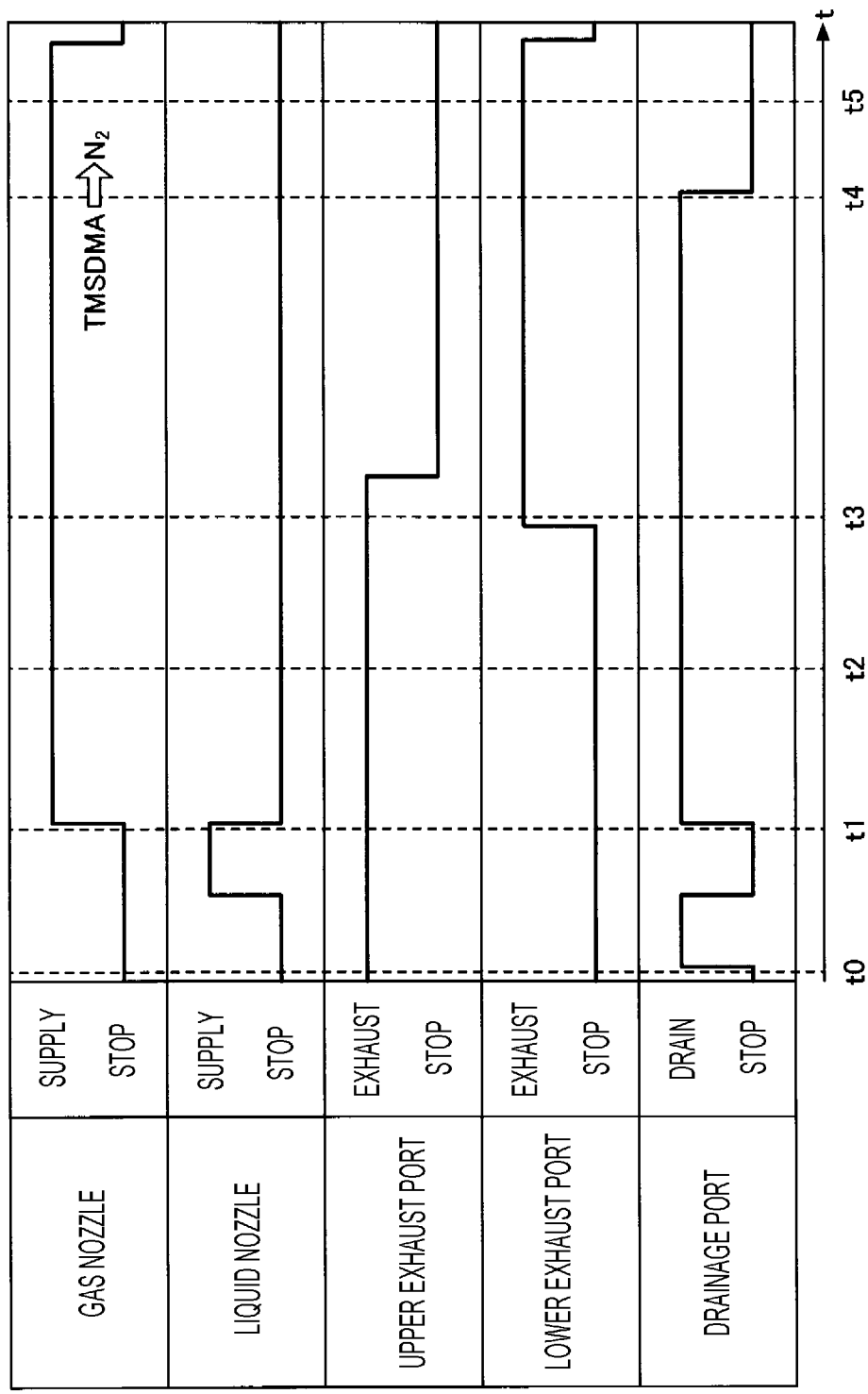
FIG. 4 is a timing chart illustrating the operation of the substrate processing apparatus according to the embodiment.

Next, the operation of a substrate processing apparatus 1 will be described with reference to FIGS. 3A to 3F and 4. In FIG. 4, the liquid nozzle is the nozzle 41 of the organic solvent supply 40, the gas nozzle is the nozzle 51 of the gas supply 50, the upper exhaust port is the second exhaust port 70, and the lower exhaust port is the exhaust port 60. The operation of the substrate processing apparatus 1 is performed under the control of the controller 90.

As illustrated in FIG. 3A, at time t0 in FIG. 4, the holder 20 is in the immersion position, and the substrate W held by the holder 20 is immersed in the aqueous layer F1. Next, the drainage port 30 discharges the aqueous layer F1 until the liquid level of the aqueous layer F1 drops to a predetermined height.

Next, as illustrated in FIG. 3B, the liquid nozzle 41 supplies the organic solvent onto the aqueous layer F1 to form the liquid layer F2 of the organic solvent.

Next, as illustrated in FIG. 3C, the drainage port 30 discharges the aqueous layer F1 and lowers the liquid layer F2. Further, the gas nozzle 51 supplies the gas of the water repellent agent to the liquid layer F2 from above the processing tank 10 while the liquid layer F2 is descending.

Next, as illustrated in FIG. 3D, due to the descent of the liquid layer F2, the exhaust port 60 is exposed to the side walls 11b and 11c of the processing tank 10, and the exhaust port 60 discharges the gas of the water repellent agent. The exhaust port 60 allows a downward flow of the gas of the water repellent agent to be formed inside the processing tank 10. Therefore, even when the height of the liquid layer F2 decreases, the water repellent agent may be sufficiently supplied to the liquid layer F2, and the entire substrate W may be made water repellent.

Next, as illustrated in FIG. 3E, the on-off valve 74 (see, e.g., FIG. 1) stops the exhaust by the second exhaust port 70. By stopping the exhaust by the second exhaust port 70, a downward flow of the gas of the water repellent agent may be reliably formed inside the processing tank 10.

As illustrated in FIG. 4, the stop of exhaust by the second exhaust port 70, which is the upper exhaust port, may be performed after the start of exhaust by the exhaust port 60, which is the lower exhaust port. As illustrated in FIG. 3D, when the exhaust of the exhaust port 60 is started, the height of the liquid level does not sufficiently decrease, and the gas flow may be obstructed by the turbulence of the liquid level.

The exhaust by the second exhaust port 70 is continued until the set time elapses from the start of exhaust by the exhaust port 60 and the height of the liquid level drops sufficiently. As a result, it is possible to suppress an increase in the pressure inside the processing tank 10 and prevent an unintended leakage of the gas of the water repellent agent.

As illustrated in FIG. 3E, the drainage port 30 also drains the liquid layer F2 and empties the inside of the processing tank 10.

Next, as illustrated in FIG. 3F, the gas nozzle 51 supplies $N_2$ gas instead of the gas of the water repellent agent, and discharges the gas of the water repellent agent remaining inside the processing tank 10. Further, the gas nozzle 51 may supply the $N_2$ gas after supplying the gas of the organic solvent instead of the gas of the water repellent agent.

According to an aspect of the present disclosure, the amount of the water repellent agent used may be reduced, and the entire substrate may be made water repellent.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
a processing tank configured to store an aqueous layer in which a substrate is immersed;
a holder configured to hold the substrate;
an organic solvent supply including an organic solvent nozzle configured to supply an organic solvent onto the aqueous layer, thereby forming a layer of the organic solvent;
a drainage port configured to discharge the aqueous layer from a bottom wall of the processing tank and cause the layer of the organic solvent to descend from above the substrate to below the substrate;
a gas supply including a gas nozzle positioned above the processing tank, the gas nozzle configured to supply a gas of a water repellent agent to the layer of the organic solvent from above the processing tank while the layer of the organic solvent descends;
a first exhaust port positioned on a lower portion of a side wall of the processing tank, an opening of the first exhaust port being exposed due to the descending of the layer of the organic solvent and configured to discharge the gas of the water repellent agent without being connected to a suction source,
a second exhaust port provided above the processing tank, wherein the second exhaust port discharges the gas of the water repellent agent at least until the discharge the gas of the water repellent agent by the first exhaust port starts,
a liquid level sensor configured to measure a height of the layer of the organic solvent in the processing tank, and
a controller controls operation of the substrate processing apparatus;
based on the measurement result of the height of the layer of the organic solvent by the liquid level sensor, the controller is configured to stop the exhaust of the gas of the water repellent agent by the second exhaust port;
the gas nozzle supplies the gas of the water repellent agent from the gas nozzle positioned above the processing tank, so that the gas of the water repellent agent inside the processing tank is pushed out through the first exhaust port by the gas of the water repellent agent supplied from the gas nozzle positioned above the processing tank.

2. The substrate processing apparatus according to claim 1, further comprising: an on-off valve in communication with the controller and configured to stop the exhaust by the second exhaust port simultaneously with or after the start of the exhaust by the first exhaust port; and the controller is configured to control the on-off valve based on the measurement result of the liquid level sensor.

3. The substrate processing apparatus according to claim 1, further comprising: an exhaust line extending from the first exhaust port, wherein a height of an upper end of the exhaust line is greater than a height of an upper end of the processing tank.

4. The substrate processing apparatus according to claim 3, further comprising: a gas-liquid separator connected to the first exhaust port through the exhaust line, wherein the gas-liquid separator separates and discharges the gas of the water repellent agent and a liquid of the layer of the organic solvent.

5. The substrate processing apparatus according to claim 1, wherein the first exhaust port is provided on a pair of side walls of the processing tank facing each other.

* * * * *